United States Patent [19]
You et al.

[11] Patent Number: 6,128,218
[45] Date of Patent: Oct. 3, 2000

[54] HYBRID MEMORY DEVICE

[75] Inventors: Min-Young You; Jong-Hoon Park, both of Choongcheongbuk-do, Rep. of Korea

[73] Assignee: Hyundai Electronics Industries Co., Ltd., Ichon, Rep. of Korea

[21] Appl. No.: 09/377,163

[22] Filed: Aug. 19, 1999

[30] Foreign Application Priority Data

Oct. 28, 1998 [KR] Rep. of Korea ............................ 45395

[51] Int. Cl.$^7$ ................................................. G11C 11/00
[52] U.S. Cl. ............................ 365/156; 365/154; 365/205
[58] Field of Search ................................... 356/156, 154, 356/205, 207, 208

[56] References Cited

U.S. PATENT DOCUMENTS

| | | | |
|---|---|---|---|
| 5,311,464 | 5/1994 | Tasake et al. ............................ | 365/156 |
| 5,406,510 | 4/1995 | Mihara et al. ............................ | 365/145 |
| 5,581,505 | 12/1996 | Lee .......................................... | 365/189 |
| 5,757,690 | 5/1998 | McMahon ................................. | 365/104 |
| 5,867,443 | 2/1999 | Linderman ............................... | 365/228 |
| 5,880,999 | 3/1999 | Ansel et al. ........................ | 365/189.09 |

*Primary Examiner*—Richard Elms
*Assistant Examiner*—Hien Nguyen
*Attorney, Agent, or Firm*—Fleshner & Kim, LLP

[57] ABSTRACT

A hybrid memory device according to the present invention has a RAM cell and a ROM cell that separately operate, and is capable of loading data in the ROM cell to the RAM cell. In such a hybrid memory device, to transfer the data in the ROM cell to common bit lines, transistors are respectively provided between the bit lines and the ROM cell. Accordingly, even when loading the data in the ROM cell to the RAM cell, the RAM and ROM cells can be separately operated.

31 Claims, 4 Drawing Sheets

FIG. 1
BACKGROUND ART
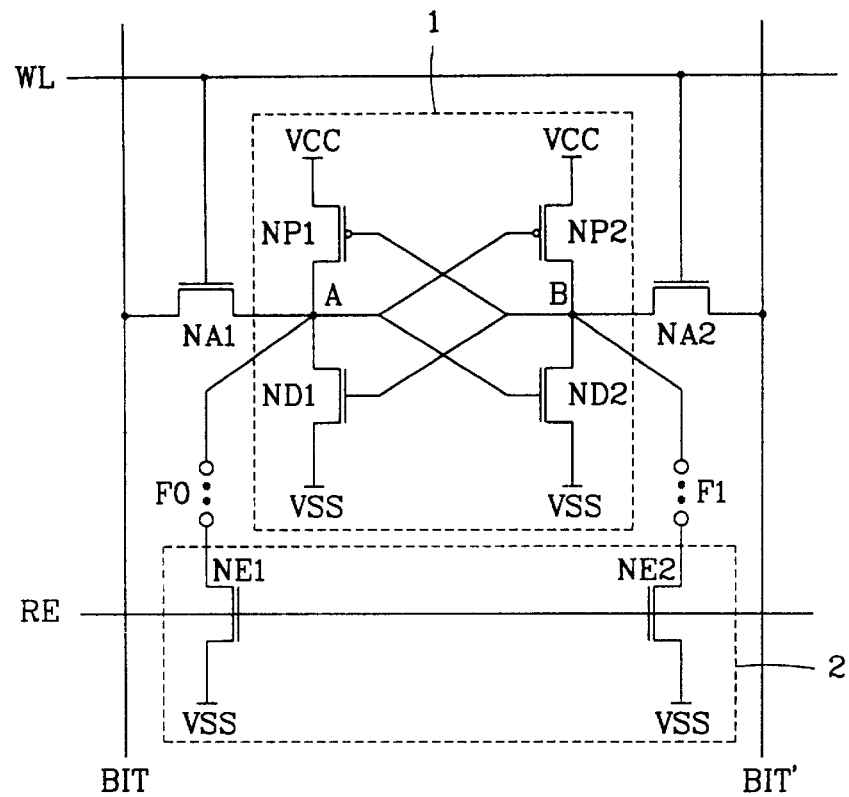
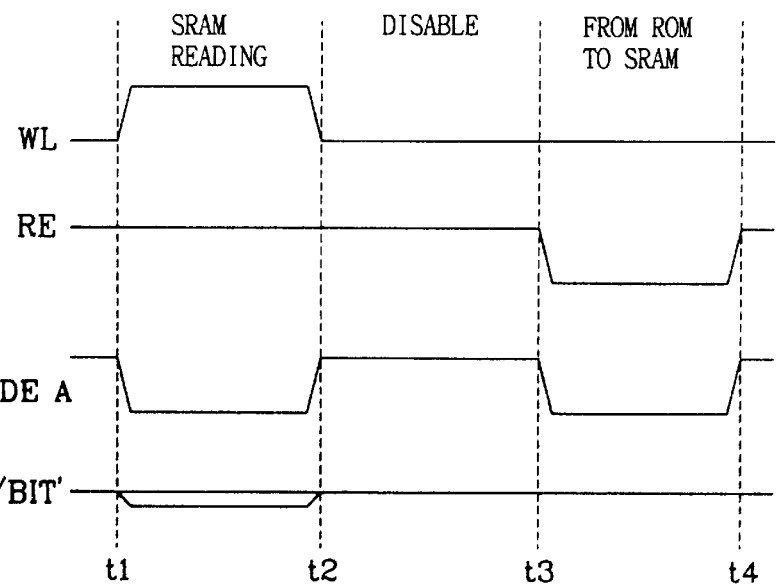
FIG. 2A BACKGROUND ART — WL
FIG. 2B BACKGROUND ART — RE
FIG. 2C BACKGROUND ART — NODE A
FIG. 2D BACKGROUND ART — BIT/BIT'

FIG. 3
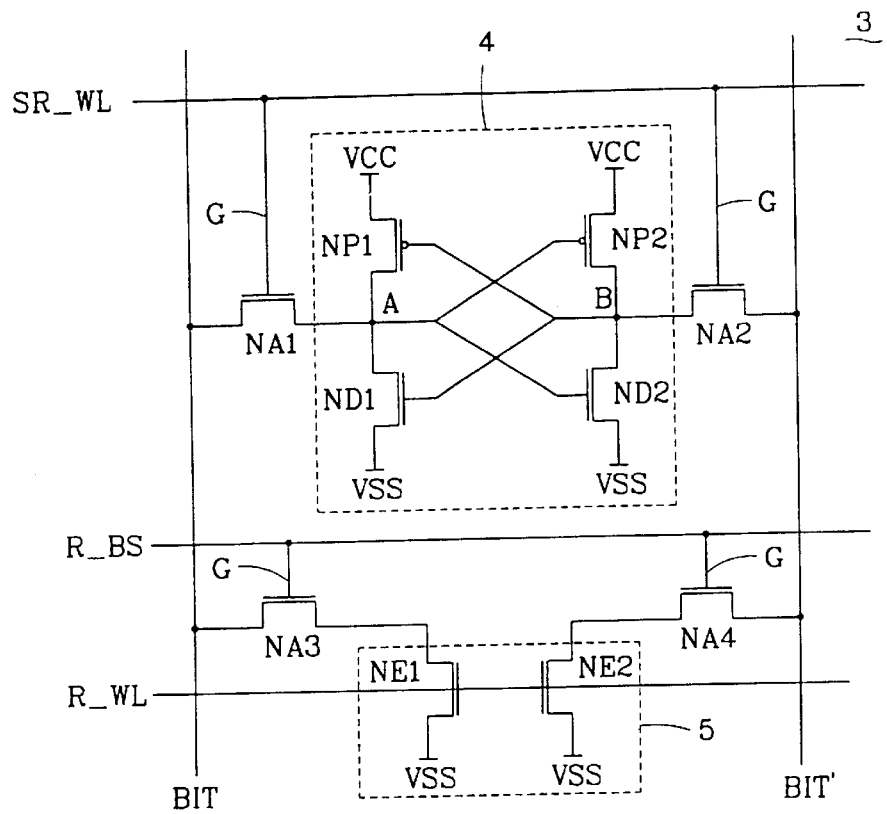
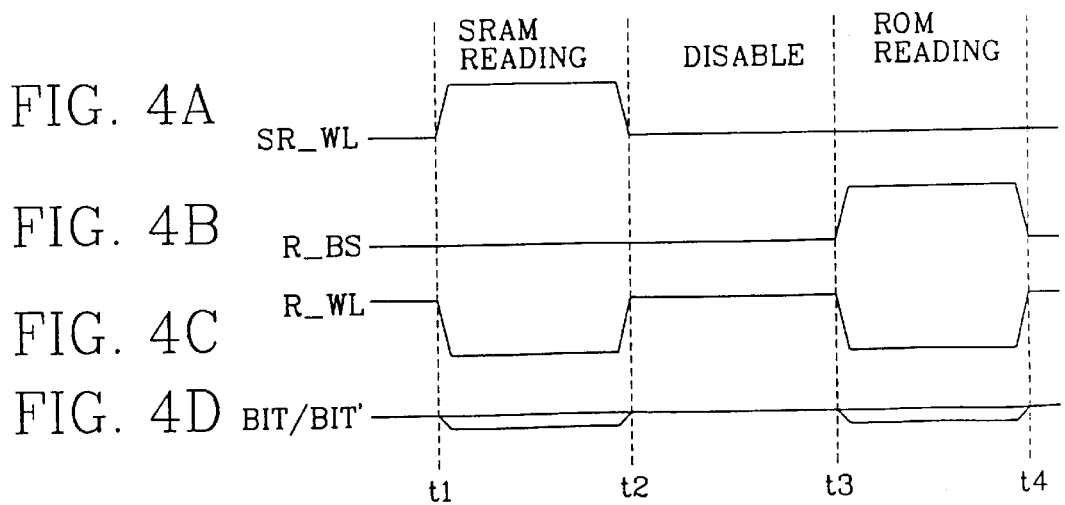
FIG. 4A SR_WL
FIG. 4B R_BS
FIG. 4C R_WL
FIG. 4D BIT/BIT'

HYBRID MEMORY DEVICE

BACKGROUND OF THE INVENTION

1. Field of the Invention

The present invention relates to a memory device, and more particularly to a hybrid memory device.

2. Background of the Related Art

While static random access memory (e.g., SRAM) and read-only memory (e.g, ROM) generally operate as separate memory devices, a hybrid memory device contains both SRAM and ROM cells operating as a single memory device. Hybrid memory devices contain SRAM nodes coupled to ROM nodes. Therefore, data can be loaded directly from the ROM cell to the SRAM cell without passing through any external circuits.

FIG. 1 shows a related art hybrid memory device containing an SRAM cell 1 and a ROM cell 2. Both of those cells 1, 2 use two bit lines BIT, BIT'. The SRAM cell 1 uses a word line WL for selecting the bitlines BIT, BIT', while the ROM cell 2 uses ROM cell enabling signal RE for reading the ROM cell 2. Two nodes A, B in the SRAM cell 1 store data. The NMOS transfer (or access) transistors NA1, NA2 transmit data between the nodes A, B and the bitlines BIT, BIT', respectively, based on the word line signal on the word line WL.

The SRAM cell 1 includes a first PMOS transistor NP1 and a first NMOS transistor ND1 connected in series to form a first inverter. Similarly, a second PMOS transistor NP2 and a second NMOS transistor ND2 are connected in series to form a second inverter. A first node A is between the drain of the first PMOS transistor NP1 and the source of the first NMOS transistor ND1, while a second node B is between the drain of the second PMOS transistor NP2 and the second NMOS transistor ND2. The gates of the second inverter are connected to the first node A, while the gates of the first inverter are connected to the second node B. The NMOS transfer transistors NA1, NA2 transmit data between the first and second nodes A, B and the bitlines BIT, BIT' based on the word line signal on the word line WL.

The ROM cell 2 includes a first and second NMOS transistor NE1, NE2. The transistors NE1, NE2 are connected with the first and second nodes A, B of the SRAM cell through a first and second fuse F0, F1, respectively.

The SRAM cell 1 reads data directly from the ROM cell 2 as shown in FIGS. 2A through 2D at time t3. The SRAM cell 1 stores initial data in the nodes A, B when the ROM cell enabling signal RE is transited to a 'low' level. That initial data is formed in the ROM cell 2 by masking. When the first NMOS transistor NE1 is connected with the first fuse F0, that first NMOS transistor NE1 is masked. The second NMOS transistor NE2 is in a normal state when the second fuse F1 is opened. In the SRAM cell 1 at that time, the first node A stores data at a 'low' level and the second node B stores data at a 'high' level according to a latch system of the SRAM cell 1.

When the state of the first fuse F0 is open and the state of the second fuse F1 is connected, the first node A stores data at a 'high' level and the second node B stores data at a 'low' level. Thus, the ROM data can be directly loaded to the SRAM cell 1 without passing through an external circuit because the nodes A, B of the SRAM cell 1 are connected to the ROM cell 2.

Once the data of the ROM cell 2 is loaded to the SRAM cell 1, the ROM cell selecting signal RE transits to a 'high' level. Then, the word line WL can select the bitlines BIT, BIT' to perform a read/write operation at the SRAM cell 1 independent of the ROM cell 2. That state is shown in FIGS. 2A through 2D at time t1. The word line signal WL and ROM cell enabling signal RE are both transited to a 'high' level. The first node A is transited to a 'high' level, while the second node B is transited to a 'low' level. The hybrid memory device is in a disabled state at time t2 and time t4.

However, the related art has various disadvantages. Since the cell nodes of the SRAM cell 1 are connected with the ROM cell in the hybrid memory device, when the data in the ROM cell 2 is externally required, data in the SRAM cell 1, different from the data in the ROM cell 2, is destroyed. In addition, because the SRAM and ROM cells 1, 2 have common nodes, the data is stored in the first and second NMOS transistors NE1, NE2 at different levels. Thus, a SRAM cell must be provided to a ROM cell, resulting in decreased integration.

The above description and other related art of hybrid memory are incorporated by reference herein where appropriate for appropriate teachings of additional or alternative details, features and/or technical background.

SUMMARY OF THE INVENTION

Accordingly, the present invention is directed to a hybrid memory device which obviates at least one or more of the problems and disadvantages of the conventional art.

An object of the present invention is to provide a hybrid memory device that has independently operational memory cells, with one cell capable of reading data directly from the other cell.

Another object of the present invention is to provide a hybrid memory device that includes a memory cell capable of reading and writing memory cells that are capable of being read.

To achieve these and other advantages and in accordance with the purpose of the present invention, as embodied and broadly described, a hybrid memory device includes: first and second bit lines; a random access memory (RAM) cell and at least a read-only memory (ROM) cell provided between the first and second bit lines; RAM-side data transfer means between the first and second bit lines and the RAM cell for writing/reading data to/from the RAM cell; and ROM activation means between the first and second bit lines and the ROM cell for reading the ROM data, wherein only one of the RAM-side data transfer means and the ROM activation means is activated for operating the RAM cell or the ROM cell, and the RAM-side transfer means and the ROM activation means are simultaneously operated for loading the data of the ROM cell to the RAM cell.

The present invention can be achieved in a whole or in parts by a hybrid memory device having a memory device comprising first and second bit lines; a first memory cell coupled between the first and second bit lines and responsive to a first word line; a second memory cell coupled between the first and second bit lines and responsive to a second word line, the first and second memory cells being different types of memory cells; a first switching device to allow transfer of data to or from the first memory cell; and a second switching device coupled to at least one of the first and second bit lines for transfer of data to or from the second memory cell.

The present invention can be also achieved in a whole or in parts by a memory device comprising first and second bit lines, a random access memory cell coupled between the first and second lines and responsive to a first word line signal, a read-only memory cell coupled between the first and second bit lines and responsive to a second word line signal, a first switching device coupled to at least one of the first and second bit lines to allow at least one of transfer of data to and from the random access memory cell, and a second switching device coupled to at least one of the first and second bit lines for transfer of data from the read-only memory cell.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 illustrates a circuit diagram of a related art hybrid memory device;

FIGS. 2A through 2D are diagrams illustrating waveforms of units in FIG. 1;

FIG. 3 illustrates a circuit diagram of a hybrid memory device according to a first embodiment of the present invention;

FIGS. 4A through 4D are diagrams illustrating waveforms of units in FIG. 3;

DETAILED DESCRIPTION OF PREFERRED EMBODIMENTS

Figure 5:
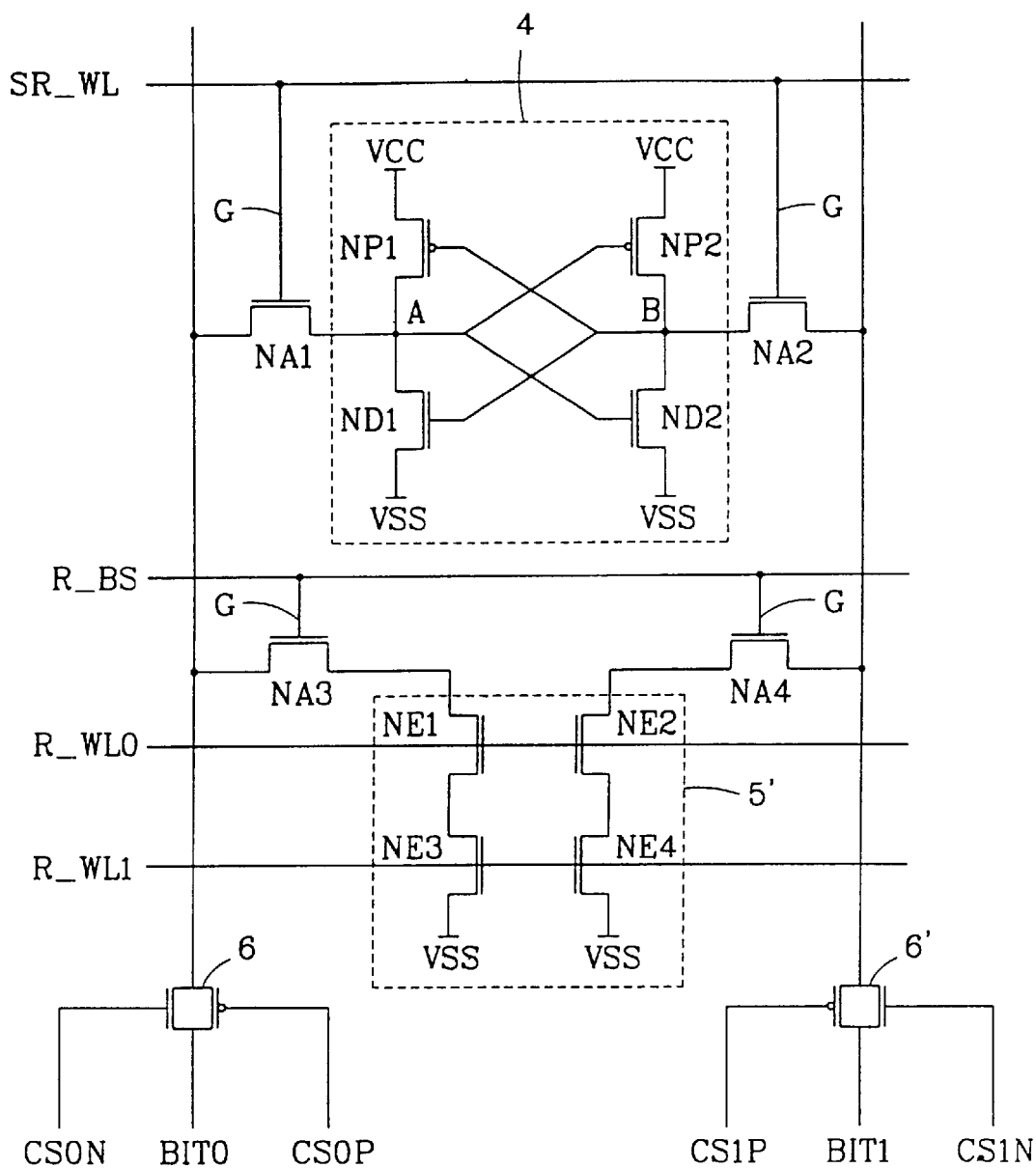
FIG. 5 illustrates a circuit diagram of a hybrid memory device according to a second embodiment of the present invention.

FIG. 3 illustrates a first embodiment of a hybrid memory device according to the present invention. A hybrid memory device 3 contains a SRAM cell 4 and a ROM cell 5. As can be appreciated, a plurality of ROM cells may be connected to the SRAM cell 4.

The SRAM cell 4 has a plurality of transistors NP1, NP2, ND1, ND2 connected to first and second bit lines BIT, BIT' through transfer transistors NA1, NA2, respectively. The ROM cell 5 includes NMOS ROM mode transistors NE1, NE2 and is connected first and second bit lines BIT, BIT' through transfer transistors NA3, NA4, respectively.

An SRAM word line SR_WL selects the SRAM cell 4, and is connected with gate terminals G of NMOS transfer (or access) transistors NA1, NA2 to allow transfer of data to/from the SRAM cell 4. Based on the SRAM word line SR_WL, the NMOS transfer transistors NA1, NA2 transit between the 'on' and 'off' positions.

A ROM word line R_WL transmits a ROM cell-selecting signal, which controls the NMOS transfer transistors NA3, NA4 located between the ROM cell 5 and the bit lines BIT, BIT'. Those transistors NA3, NA4 respond to a ROM activation signal R_BS to allow transfer of data from the ROM cell 5 to the bit lines BIT, BIT'.

According to the preferred embodiment of the present invention, the SRAM cell 4 and the ROM cell 5 can operate independently.

FIGS. 4A through 4D illustrate the hybrid memory operation. At time t1, the SRAM cell selecting signal SR_WL is transited to a 'high' level, while the ROM cell activation signal R_BS and the ROM word line R_WL are at a 'low' and a 'high' level, respectively. When the ROM cell activation signal R_BS is at the 'low' level, the NMOS transfer transistors NA3, NA4 receive that signal R_BS through the gate terminals G and are switched to the 'off' position, thus electrically separating the ROM cell 5 from the first and second bit lines BIT, BIT'. At that point, only the SRAM cell 4 is in an operative state, and the SRAM cell 4 reading operation can be performed.

The reading operation is performed by transiting a potential of the SRAM word line SR_WL to a 'high' level at time t1. As the SRAM cell selecting signal transmitted through the SRAM word line SR_WL is transited to the 'high' level, the NMOS transfer transistors NA1, NA2 receive the SRAM word line SR_WL through the corresponding gate terminals G and are transited to the 'on' position. Accordingly, the first and second bit lines BIT, BIT' are electrically connected with the SRAM cell 4, and the data in the cell nodes A, B of the SRAM cell 4 is read through the NMOS transfer transistors NA1, NA2 to the first and second bit lines BIT, BIT'.

The writing operation of the SRAM cell 4 is carried out by storing the data transmitted from the bit lines BIT, BIT' and NMOS transfer transistors NA1, NA2 to the cell nodes A, B while the potential of the SRAM word line signal SR_WL maintains its 'high' level. Although the SRAM cell and the ROM cells are commonly connected with the first and second bit lines BIT, BIT', only the SRAM cell 4 performs the writing operation, as the ROM cell 5 is inactivated by maintaining the ROM cell activation signal R_BS at the 'low' level.

Since the ROM cell 5 requires only the read operation, the ROM cell activation signal R_BS is transited to a 'high' level and the SRAM word line SR_WL is transited to a 'low' level. Then, the SRAM word line SR_WL transits the NMOS transfer transistors NA1, NA2 to the 'off' position. At that point, the SRAM cell 4 is electrically separated from the first and second bit lines BIT, BIT'. The ROM cell 5 is electrically connected with the bitlines BIT, BIT' when the ROM cell activation signal R_BS at the 'high' level is applied to the NMOS transfer transistors NA3, NA4, and the NMOS transfer transistors NA3, NA4 are transited to the 'on' position. When the ROM word line signal R_WL transmits to a 'low' level at time t3, the selected data in the ROM cell is transferred through the NMOS transistors NA3, NA4 to the bit lines BIT, BIT', and the data of the ROM cell is read. When the first NMOS ROM transistor NE1 is masked and the second NMOS ROM mode transistor NE2 is in the normal state, the masked first transistor NE1 is in the 'on' position. Data at the 'low' level is transferred to the bit lines BIT, BIT' when the ROM word line signal R_WL is at a 'low' level. When the first NMOS ROM transistor NE1 is in a normal state and the second NMOS ROM transistor NE2 is masked, the first transistor NE1 transits to the 'off' position, and the data at the high level is transferred to the bit lines BIT, BIT' when the ROM word line signal R_WL is at the 'low' level.

As mentioned above, the SRAM cell 4 and the ROM cell 5 can operate independently in the hybrid memory device. When the data of the ROM cell 5 is loaded to the SRAM cell 4 during system initialization, the data read from the ROM cell 5 can be transferred through the bit lines BIT, BIT' and written in the selected SRAM cell 4 by transiting the SRAM word line SR_WL and the ROM activation signal R_BS to the 'high' level during the same time.

When writing predetermined data from the NMOS ROM mode transistors NE1, NE2, the threshold voltages should be opposite based on a masking process in an ion implantation. Since the SRAM and ROM cells 4, 5 use the bit lines BIT, BIT' commonly, the logic levels of the bit lines BIT, BIT' oppose one another. That is, the data of the ROM cell 5 can be loaded to the SRAM cell 4 by enabling the two NMOS ROM mode transistors NE1, NE2 to have opposite data based on opposite threshold voltages.

FIG. 5 shows a second embodiment of the present invention. The hybrid memory device is similarly constructed to the first embodiment except that first and second transfer gates 6, 6' are provided to first and second bit lines BIT0, BIT1, respectively. The common elements between FIG. 5 and FIG. 3 are labeled identically, and the cumulative detailed description is omitted for convenience.

The NMOS ROM transistors NE1–NE4 operate as NAND logic gates in the ROM cells. Thus, four ROM cells can be configured for the SRAM cell 4. While the ROM cells can be configured as NOR logic gates, the present embodiment uses NAND logic gates because the construction of the NAND logic gate is more beneficial to the integration than that of the NOR logic gate. However, the application of the NOR logic gate and other logic gates is also within the scope of the present invention.

The first and second transfer gates 6, 6' are switches which are controlled by control signals CS0N, CS0P and CS1N, CS1P, respectively. The signals CS0P, CS1P are the inverted signals of the signals CS0N, CS1N. When the data of the ROM cell 5 is separately outputted through the transfer gates 6, 6', the first and third NMOS ROM transistors NE1, NE3 are connected with the first bit line BIT0 and the second and fourth NMOS ROM transistors NE2, NE4 are connected with the second bit line BIT1. Therefore, the bit lines BIT0, BIT1 are not inverted when operating the ROM cell 5, but are inverted during SRAM cell operation.

When reading the data of the first or second NMOS ROM mode transistor, NE1, NE2, the potentials of the first and second ROM word lines R_WL0, R_WL1 are at a 'high' and a 'low' level, respectively. The coupled NMOS ROM mode transistors NE1, NE3 and NE2, NE4 are serially connected between the NMOS transfer transistors NA3, NA4 and ground. When the first NMOS ROM mode transistor NE1 is turned on, the data of the third NMOS ROM mode transistor NE3 is transferred through the first NMOS ROM mode transistor NE1 and the NMOS transistor NA3 to the bit line BIT0.

The transfer gates 6, 6' can also be used for the operation of the SRAM cell 4. The first and second bit lines BIT0, BIT1 connected with the SRAM cell 4 maintain opposite logic levels. Both transfer gates 6, 6' should be in an 'on' position to read and write the data to and from the SRAM cell 4, respectively. The ROM cell reading operation allows the transfer gates 6, 6' to be separately operated as described above.

Figure 6:
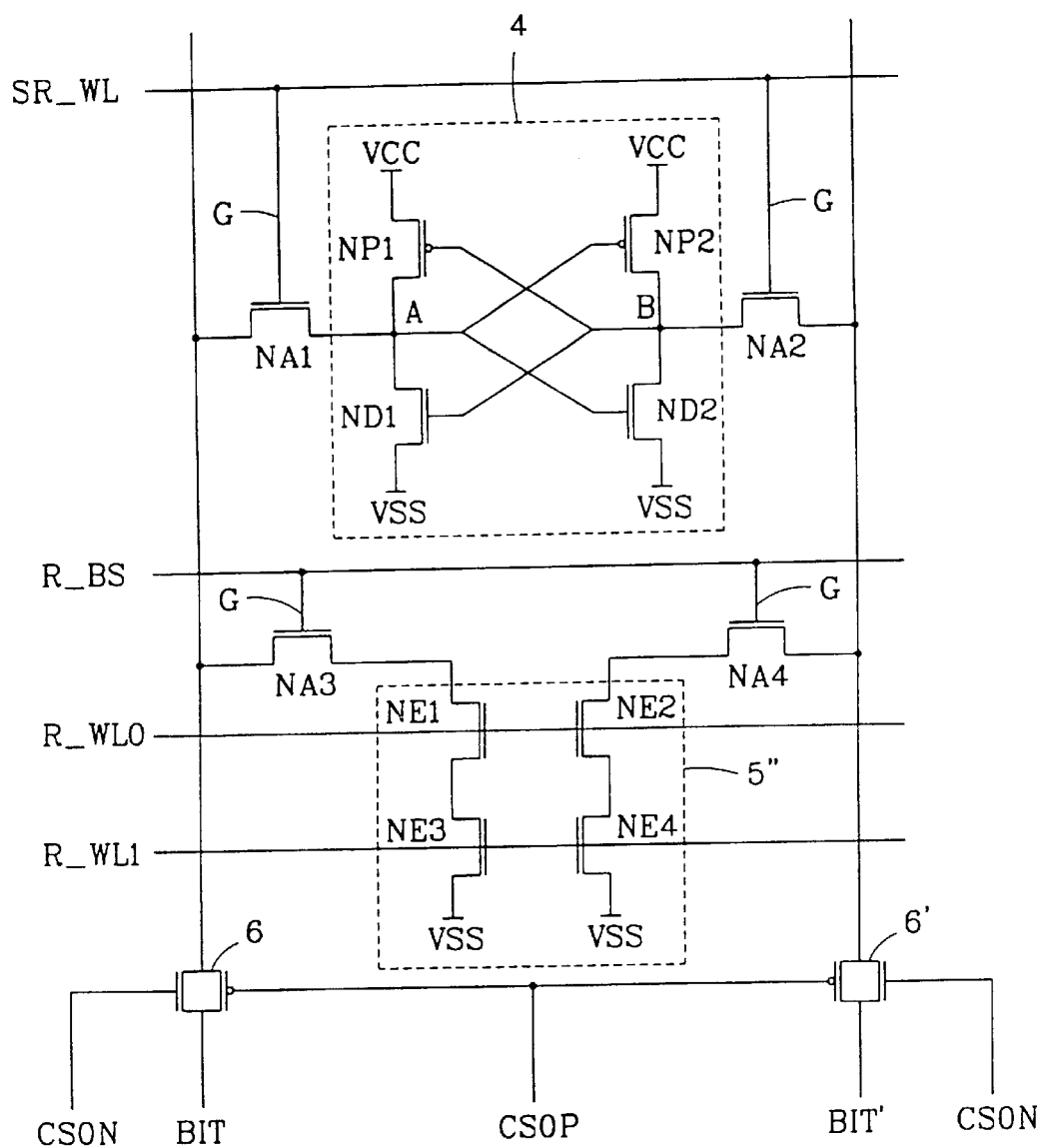
FIG. 6 illustrates a circuit diagram of a hybrid memory device according to a third embodiment of the present invention.

FIG. 6 illustrates a third embodiment of the hybrid memory device. The common elements between FIG. 6 and FIG. 5 are labeled with the same reference number, and the cumulative detailed description is omitted.

A plurality of ROM cells 5" is provided with the 2 ROM cells operated with a single SRAM cell 4. The embodiment in FIG. 5 is different from the embodiment in FIG. 6 in that control signals CS0N, CS0P are commonly applied to the first and second transfer gates 6, 6' which are additionally provided to first and second bit lines BIT, BIT', respectively.

A plurality of ROM word lines R_WL0, R_WL1 are provided for selecting the ROM cells 5, and the word lines apply a ROM cell selecting signal through a ROM word line to the specific ROM cell to be selected. Based on the control signals CS0N, CS0P applied to the first and second transfer gates 6, 6', first and second NMOS transistors NE1, NE2 and third and fourth transistors NE3, NE4 are operated as pairs to perform the operations of the ROM cells 5".

In the present embodiment, the SRAM functions in a similar manner as described above and illustrated in FIG. 5.

The independent operation of the SRAM cell and ROM cells in the hybrid memory device according to the preferred embodiments of the present invention prevents the data of the SRAM cell from being destroyed when the RAM cell is in use. Further, it is possible to write the data of the ROM cell to the SRAM cell during a system initialization using such a hybrid memory device. Moreover, the present invention allows a plurality of ROM cells to be configured to a single SRAM cell.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device comprising
first and second bit lines;
a first memory cell coupled between the first and second bit lines and responsive to a first word line signal;
a second memory cell coupled between the first and second bit lines and responsive to a second word line signal, the first and second memory cells being different type of memory cells;
a first switching device coupled to at least one of the first and second bit lines to allow at least one of transfer of data to and from the first memory cell; and
a second switching device coupled to at least one of the first and second bit lines for transfer of data from the second memory cell.

2. The memory device of claim 1, wherein the first memory cell operates independently of the second memory cell.

3. The memory of device of claim 1, wherein the first memory cell and the second memory cell perform a read operation concurrently.

4. The memory of device of claim 1, wherein the first memory cell performs a write operation concurrently with the second memory cell performing a read operation.

5. The memory of device of claim 1, wherein the first memory cell performs a read operation while the second memory cell is disabled.

6. The memory of device of claim 1, wherein the first memory cell performs a write operation while the second memory cell is disabled.

7. The memory of device of claim 1, wherein the second memory cell performs a read operation while the first memory cell is disabled.

8. The memory of device of claim 1, wherein the first memory cell is a random access memory cell and the second memory cell is a read-only memory cell.

9. The memory device of claim 8, wherein the random access memory cell is a static random access memory cell.

10. The memory device of claim 9, wherein the read-only memory cell operates as one of NAND logic gates and NOR logic gates.

11. The memory of device of claim 1, wherein the first switching device comprises first and second transistors coupled between the first memory cell and the first and second bit lines, respectively.

12. The memory device of claim 11, wherein the first memory cell comprises first, second, third and fourth memory cell transistors, each transistor of the first memory cell and the first switching device having first and second electrodes and a control electrode wherein:

the first electrodes of each of the first and second memory cell transistors are coupled to each other in series, and commonly coupled to the control electrodes of the third and fourth memory cell transistors and the second electrode of the first transistor of the first switching device;

the first electrodes of each of the third and fourth memory cell transistors are coupled in series, and commonly coupled to the control electrodes of the first and second memory cell transistors and the second electrode of the second transistor of the first switching device;

the first electrodes of each of the first and second transistor of the first switching device are coupled to the first and second bit lines, respectively; and the control electrodes of each of the first and second transistors of the first switching device are coupled for receiving the first word line signal.

13. The memory device of claim 1, wherein the second switching device comprises first and second transistors, each having first and second electrodes and a control electrode, wherein the first electrode of the first transistor is coupled to the first bit line, the second electrode of the first transistor is coupled to the second memory cell, and the control electrode of the first transistor is coupled for receiving an activation signal; and the first electrode of the second transistor is coupled to the second bit line, the second electrode of the second transistor is coupled to the second memory cell, and the control electrode of the second transistor is coupled for receiving the activation signal.

14. The memory device of claim 13, wherein the second memory cell comprises:

first and second memory cell transistors, each having first and second electrodes and a control electrode, wherein the first electrode of the first memory cell transistor is coupled in series with the second electrode of the first transistor of the second switching device, the second electrode of the first memory cell transistor is coupled for receiving a prescribed first potential, and the control electrode of the first memory cell transistor is coupled for receiving the second word line signal; and the first electrode of the second memory cell transistor is coupled in series with the second electrode of the second transistor of the second switching device, the second electrode of the second memory cell transistor is coupled for receiving the first prescribed potential, and the control electrode is coupled for receiving the second word line signal.

15. The memory device of claim 13, wherein the second switching device further comprises:

first and second transfer gates coupled to the first and second bit lines, respectively; and the first transfer gate being responsive to first and second control signals and the second transfer gate being responsive to third and fourth control signals.

16. The memory device of claim 15, wherein the second memory cell comprises first, second, third and fourth memory cell transistors, each having first and second electrodes and a control electrode, the first electrodes of the first and second memory cell transistors being coupled in series to the second electrodes of the first and second transistors, respectively, of the second switching device;

the second electrodes of each of the first and second memory cell transistors being coupled in series to the first electrodes of the third and fourth memory cell transistors, respectively;

the control electrodes of the first and second memory cell transistors being commonly coupled for receiving the second word line signal;

the control electrodes of the third and fourth memory cell transistors being commonly coupled for receiving to a third word line signal; and the second electrodes of the third and fourth memory cell transistors being coupled to a prescribed first potential.

17. The memory device of claim 15, wherein the second control signal is an inverted signal of the first control signal, and the fourth control signal is an inverted signal of the third control signal.

18. The memory device of claim 15, wherein the first and third control signals are identical signals, and the second and fourth control signals are identical signals.

19. The memory device of claim 1, wherein the second memory cell operates as one of NAND logic gates and NOR logic gates.

20. The memory device of claim 1, wherein the second switching device includes:

first and second transfer gates coupled to the first and second bit lines, respectively; and the first transfer gate being responsive to first and second control signals, and the second transfer gate being responsive to third and fourth control signals.

21. A memory device comprising:

first and second bit lines;

a random access memory cell coupled between the first and second bit lines and responsive to a first word line signal;

a read-only memory cell coupled between the first and second bit lines and responsive to a second word line signal;

a first switching device coupled to at least one of the first and second bit lines to allow at least one of transfer of data to and from the random access memory cell; and a second switching device coupled to at least one of the first and second bit lines for transfer of data from the read-only memory cell.

22. The memory device of claim 21, wherein the random access memory cell performs one of:

(1) an operation independent of an operation of the read-only memory cell;

(2) a read operation concurrent with the read-only memory cell;

(3) a write operation concurrent while the read-only memory cell performs a read operation;

(4) a read operation while the read-only memory cell is disabled;

(5) a write operation while the read-only memory cell is disabled; and (6) a disabling operation that disables the random-access memory cell while the read-only memory cell performs a read operation.

23. The memory device of claim 21, wherein the first switching device comprises first and second transistors coupled between the random access memory cell and the first and second bit lines, respectively.

24. The memory device of claim 23, wherein the random access memory cell comprises first, second, third and fourth memory cell transistors, each transistor of the random access memory cell and the first switching device having first and second electrodes and a control electrode, wherein:

the first electrodes of each the first and second memory cell transistors are coupled to each other in series, and commonly coupled to the control electrodes of the third and fourth memory cell transistors and the second electrode of the first transistor of the first switching device;

the first electrodes of each of the third and fourth memory cell transistors are coupled in series, and commonly coupled to the control electrodes of the first and second memory cell transistors and the second electrode of the second transistor of the first switching device;

the first electrodes of each of the first and second transistors of the first switching device are respectively coupled to the first and second bit lines; and the control electrodes of each of the first and second transistors of the first switching device are coupled for receiving the first word line signal.

25. The memory device of claim 21, wherein the second switching device comprises first and second transistors, each having first and second electrodes and a control electrode, wherein:

the first electrode of the first transistor is coupled to the first bit line, the second electrode of the first transistor is coupled to the read-only memory cell, and the control electrode of the first transistor is coupled for receiving an activation signal; and the first electrode of the second transistor is coupled to the second bit line, the second electrode of the second transistor is coupled to the read-only memory cell, and the control electrode of the second transistor is coupled for receiving the activation signal.

26. The memory device of claim 25, wherein the read-only memory cell comprises:

first and second memory cell transistors, each having first and second electrodes and a control electrode, wherein the first electrode of the first memory cell transistor is coupled in series with the second electrode of the first transistor of the second switching device, the second electrode of the first memory cell transistor is coupled for receiving a prescribed first potential, and the control electrode of the first memory cell transistor is coupled for receiving the second word line signal; and the first electrode of the second memory cell transistor is coupled in series with the second electrode of the second transistor of the second switching device, the second electrode of the second memory cell transistor is coupled for receiving the first prescribed potential, and the control electrode is coupled for receiving the second word line signal.

27. The memory device of claim 21, wherein the second switching device includes:

first and second transfer gates coupled to the first and second bit lines, respectively; and the first transfer gate being responsive to first and second control signals and the second transfer gate being responsive to third and fourth control signals.

28. The memory device of claim 27, wherein the read-only memory cell comprises first, second, third and fourth memory cell transistors, each having first and second electrodes and a control electrode, the first electrodes of the first and second memory cell transistors being coupled in series to the second electrodes of the first and second transistors, respectively, of the second switching device;

the second electrodes of each of the first and second memory cell transistors being coupled in series to the first electrodes of the third and fourth memory cell transistors, respectively;

the control electrodes of the first and second memory cell transistors being commonly coupled for receiving the second word line signal;

the control electrodes of the third and fourth memory cell transistors being commonly coupled for receiving a third word line signal; and the second electrodes of the third and fourth memory cell transistors being coupled to a prescribed first potential.

29. The memory device of claim 27, wherein the second control signal is an inverted signal of the first control signal, and the fourth control signal is an inverted signal of the third control signal.

30. The memory device of claim 27, wherein the first and third control signals are identical signals, and the second and fourth control signals are identical signals.

31. The memory device of claim 21, wherein the read-only memory cell operates as one of NAND logic gates and NOR logic gates, and the random access memory cell is a static random access memory cell.

* * * * *